US012635374B2

(12) United States Patent
Chung et al.

(10) Patent No.: US 12,635,374 B2
(45) Date of Patent: May 19, 2026

(54) ELECTRONIC DEVICE, AND DISPLAY DEVICE COMPRISING THE SAME

(71) Applicant: SAMSUNG ELECTRONICS CO., LTD., Suwon-si (KR)

(72) Inventors: Deukseok Chung, Yongin-si (KR); Min Jong Bae, Yongin-si (KR); Jinsub Lee, Suwon-si (KR); Yongjoo Kwon, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1345 days.

(21) Appl. No.: 17/341,688

(22) Filed: Jun. 8, 2021

(65) Prior Publication Data

US 2022/0020943 A1 Jan. 20, 2022

(30) Foreign Application Priority Data

Jul. 14, 2020 (KR) ........................ 10-2020-0086773

(51) Int. Cl.
| | |
|---|---|
| *H10K 59/35* | (2023.01) |
| *H10K 50/115* | (2023.01) |
| *H10K 59/38* | (2023.01) |
| *H10K 59/60* | (2023.01) |
| *H10K 59/80* | (2023.01) |

(52) U.S. Cl.
CPC ......... *H10K 59/351* (2023.02); *H10K 50/115* (2023.02); *H10K 59/353* (2023.02); *H10K 59/38* (2023.02); *H10K 59/60* (2023.02); *H10K 59/8792* (2023.02)

(58) Field of Classification Search
CPC .... H10K 59/351; H10K 59/353; H10K 59/38; H10K 59/60; H10K 59/8792; H10K 59/35; H10K 50/11; H10K 50/115; H10K 2102/331; H10H 29/10–142; H10H 29/30–962; H10F 30/288; H10F 77/12–1285; H10F 39/18–1898; H10F 39/182–1825; H10F 39/184–1847; H10F 39/198
See application file for complete search history.

(56) References Cited

U.S. PATENT DOCUMENTS

| | | |
|---|---|---|
| 8,462,130 B2 | 6/2013 | Park et al. |
| 10,686,019 B2 | 6/2020 | Lee et al. |
| | (Continued) | |

FOREIGN PATENT DOCUMENTS

| | | | |
|---|---|---|---|
| CN | 101887691 B | 8/2012 | |
| CN | 111261665 A * | 6/2020 | ....... G02F 1/133602 |
| | (Continued) | | |

OTHER PUBLICATIONS

Korean Office Action dated Feb. 9, 2025, issued in corresponding Korean Patent Application No. 10-2020-0086773 (20 pages).

*Primary Examiner* — Steven B Gauthier
*Assistant Examiner* — Adam D Weiland
(74) *Attorney, Agent, or Firm* — CANTOR COLBURN LLP

(57) ABSTRACT
An electronic device includes a light emitting element having a width of less than or equal to about 20 micrometers (μm), a quantum dot color filter overlapping the light emitting element, and a photo-detecting unit which detects a first light emitted from the quantum dot color filter.

17 Claims, 9 Drawing Sheets

(56)        References Cited

U.S. PATENT DOCUMENTS

| | | | |
|---|---|---|---|
| 10,768,463 | B2 | 9/2020 | Yeo et al. |
| 10,923,541 | B2 | 2/2021 | Ju |
| 11,145,798 | B2 | 10/2021 | Yoon et al. |
| 11,271,050 | B2 | 3/2022 | Lee et al. |
| 11,469,279 | B2 | 10/2022 | Ju |
| 11,672,155 | B2 | 6/2023 | Lee et al. |
| 2014/0339495 | A1* | 11/2014 | Bibl .................... H10H 20/812 257/13 |
| 2014/0367633 | A1* | 12/2014 | Bibl .......................... G09F 9/00 257/13 |
| 2017/0040306 | A1* | 2/2017 | Kim ................. H01L 23/49894 |
| 2017/0337413 | A1* | 11/2017 | Bhat ................. G06V 40/1347 |
| 2018/0351056 | A1* | 12/2018 | Huang ................ H10H 29/142 |
| 2019/0026523 | A1 | 1/2019 | Shen et al. |
| 2019/0157354 | A1* | 5/2019 | Lee ........................ H10K 59/38 |
| 2019/0296055 | A1* | 9/2019 | Lius ...................... G02F 1/1368 |
| 2020/0035890 | A1* | 1/2020 | Yoon ................... H10H 20/821 |
| 2020/0041837 | A1 | 2/2020 | Jiang et al. |
| 2020/0127169 | A1* | 4/2020 | Ahmed ................. H01L 25/167 |
| 2020/0192015 | A1* | 6/2020 | Lin ...................... G02B 6/0053 |
| 2021/0028327 | A1* | 1/2021 | Lin .................... H01L 25/0753 |
| 2021/0104574 | A1* | 4/2021 | Behringer ........... H10H 29/142 |
| 2021/0408130 | A1* | 12/2021 | Pan .................... H10K 59/8791 |

FOREIGN PATENT DOCUMENTS

| | | | |
|---|---|---|---|
| JP | 2011215353 | A | 10/2011 |
| KR | 101719587 | B1 | 3/2017 |
| KR | 101859105 | B1 | 5/2018 |
| KR | 1020180064629 | A | 6/2018 |
| KR | 1020190058130 | A | 5/2019 |
| KR | 1020190092661 | A | 8/2019 |
| KR | 1020200012541 | A | 2/2020 |

* cited by examiner

ELECTRONIC DEVICE, AND DISPLAY DEVICE COMPRISING THE SAME

CROSS-REFERENCE TO RELATED APPLICATION

This application claims priority to Korean Patent Application No. 10-2020-0086773, filed on Jul. 14, 2020, and all the benefits accruing therefrom under 35 U.S.C. § 119, the content of which in its entirety is herein incorporated by reference.

BACKGROUND

1. Field

Embodiments of the disclosure are directed to an electronic device and a display device including the electronic device.

2. Description of the Related Art

In a mobile device, a photo-detecting sensor and an infrared ("IR") light source, which are used to impart various additional functions such as iris recognition and health care, may be commonly included therein as a sensor and a light source separate from a display device.

SUMMARY

In a mobile device including a sensor and a light source separate from a display device, since the sensor and the light source are typically separately provided in the mobile device, a circuit may become complicated and occupy a substantial space, such that only a single type sensor may be mounted, and thereby limiting the functions thereof.

An embodiment provides an electronic device with improved form factor and increased applicability by combining a display device and a photo-sensor, to provide a display device including the photo-sensor.

An embodiment provides an electronic device including a light emitting element having a width of less than or equal to about 20 micrometers (μm), a quantum dot color filter overlapping the light emitting element, and a photo-detecting unit which detects a first light emitted from the quantum dot color filter.

In an embodiment, the light emitting element may be a micro light emitting diode ("μ-LED").

In an embodiment, the first light may be in a wavelength region of about 780 nanometers (nm) to about 1500 nm.

In an embodiment, the light emitting element may emit a second light in a wavelength region of about 430 nm to about 470 nm.

In an embodiment, the quantum dot color filter may convert the second light into the first light.

In an embodiment, the photo-detecting unit may include a photodiode.

In an embodiment, the photo-detecting unit may have a width of less than or equal to about 20 μm.

In an embodiment, the electronic device may include a plurality of unit pixels, and the unit pixel may include a first sub-pixel including the photo-detecting unit, a second sub-pixel which emits the first light, and a third sub-pixel which emits a third light having a wavelength different from a wavelength of the first light.

In an embodiment, the first sub-pixel may be disposed between the second sub-pixel and the third sub-pixel.

In an embodiment, the first sub-pixel may be disposed outside the second sub-pixel or the third sub-pixel.

In an embodiment, the unit pixel may further include a fourth sub-pixel which emits a fourth light having a wavelength different from the wavelength of first light and the wavelength of the third light.

In an embodiment, the unit pixel may further include a fifth sub-pixel which emits the second light.

In an embodiment, each of the second sub-pixel and the third sub-pixel may include a light emitting element having a width of less than or equal to about 20 μm, and a quantum dot color filter disposed on the light emitting element and overlapping the light emitting element.

In an embodiment, each of the second sub-pixel and the third sub-pixel may further include partition walls which partition the quantum dot color filter.

In an embodiment, the first sub-pixel may further include a first transmission layer overlapping the photo-detecting unit. In an embodiment, the first transmission layer may be disposed in a position parallel to the light emitting element in the second sub-pixel or the third sub-pixel, and in a position parallel to the quantum dot color filter disposed on the light emitting element.

In an embodiment, the fifth sub-pixel may include a light emitting element having a width of less than or equal to about 20 μm, and a second transmission layer disposed on the light emitting element and overlapping the light emitting element.

In an embodiment, each of the second sub-pixel and the third sub-pixel may further include an overcoat layer on the quantum dot color filter.

In an embodiment, each of the second sub-pixel and the third sub-pixel may further include an absorption type color filter on the quantum dot color filter.

Another embodiment provides a display device including the electronic device.

According to embodiments of an electronic device, a form factor may be improved and applicability may be improved by combining a display device and a photo-sensor with each other.

BRIEF DESCRIPTION OF THE DRAWINGS

FIG. 2 is a schematic cross-sectional view of a unit pixel in FIG. 1, FIG. 4 is a cross-sectional view separately illustrating quantum dot color filters, an overcoat layer disposed thereon, and an absorption type color filter among the unit pixels of FIG. 2, showing an alternative embodiment of the second transmission layer, FIG. 5 is a cross-sectional view separately illustrating quantum dot color filters, an overcoat layer disposed thereon, and an absorption type color filter, among the unit pixels of FIG. 2, showing an embodiment where the unit pixel of FIG. 2 further includes a thin film encapsulation layer, FIG. 6 is a cross-sectional view separately illustrating quantum dot color filters, an overcoat layer disposed thereon, and an absorption type color filter among the unit pixels of FIG. 2, showing an embodiment where the unit pixel of FIG. 2 further includes a fourth absorption type color filter.

DETAILED DESCRIPTION

Figure 1:
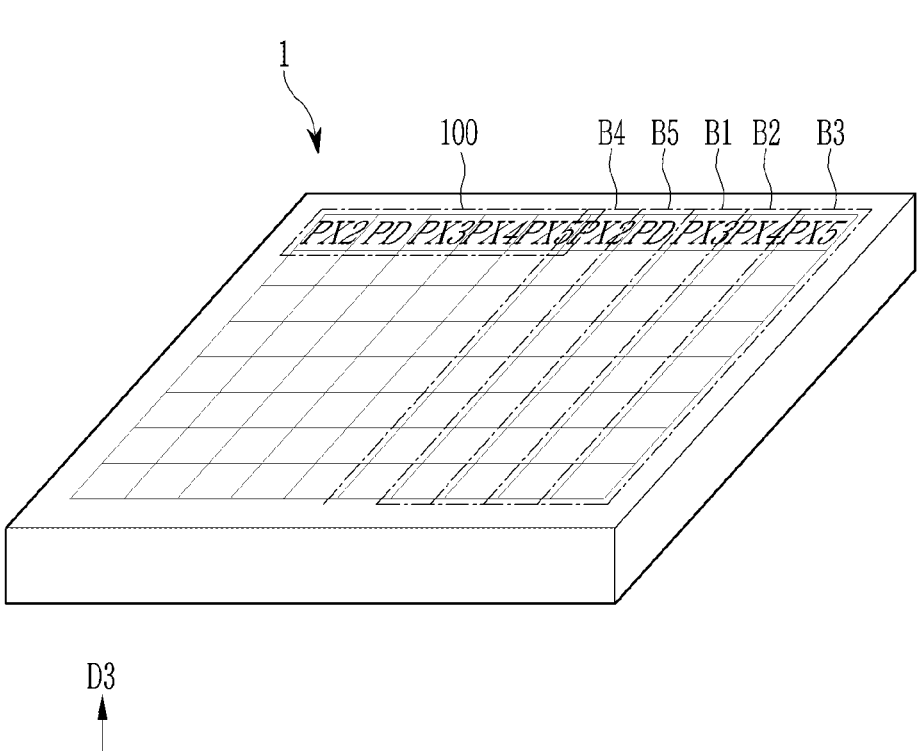
FIG. 1 is a schematic perspective view of an electronic device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present. In order to clearly describe the present disclosure, parts which are not related to the description are omitted, and the same reference numeral refers to the same or similar elements, throughout the specification. In addition, since the size and the thickness of each element shown in the drawing are optionally represented for convenience of the description, the present disclosure is not limited to the illustration.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness of layers, films, panels, regions, etc., are exaggerated for clarity. In the drawings, the thickness of a part of layers or regions, etc., is exaggerated for clarity. Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An electronic device according to an embodiment includes a light emitting element, a quantum dot color filter overlapping the light emitting element, and a photo-detecting unit which detects first light emitted from the quantum dot color filter.

Hereinafter, an electronic device 1 according to an embodiment is described with reference to FIG. 1.

FIG. 1 is a schematic perspective view of an electronic device 1 according to an embodiment.

Referring to FIG. 1, an embodiment of the electronic device 1 includes a plurality of unit pixels 100, and each unit pixel 100 may selectively emit, for example, light of red (R), green (G), and blue (B). The unit pixel 100 may include three sub-pixels of the third sub-pixel PX3, the fourth sub-pixel PX4, and the fifth sub-pixel PX5. The third sub-pixel PX3 may be a red sub-pixel, the fourth sub-pixel PX4 may be a green sub-pixel, and the fifth sub-pixel PX5 may be a blue sub-pixel. In such an embodiment, the unit pixel 100 may further include a second sub-pixel PX2 configured to selectively emit infrared ("IR") light.

The unit pixel 100 may include a first sub-pixel PD configured to detect light, e.g., IR light, and disposed between the sub-pixels PXs. The first sub-pixel PD may be provided to correspond to one or more sub-pixels PX, but is not limited thereto. In such an embodiment, the arrangement structure and position of the first sub-pixel PD may have various modified embodiments. In one embodiment, for example, the first sub-pixel PD may be disposed between the second sub-pixel PX2 and an arrangement of the third sub-pixel PX3 to the fifth sub-pixel PX5, or alternatively, may be disposed outside the second sub-pixel PX2 or the arrangement of the third the sub-pixel PX3 to the fifth sub-pixel PX5.

The plurality of sub-pixels PX arranged along a second direction D2 may emit light of a same color as each other. In one embodiment, for example, a plurality of third sub-pixels PX3 disposed along a first column B1 may emit red light, a plurality of fourth sub-pixels PX4 disposed along a second column B2 may emit green light, and the plurality of fifth sub-pixels PX5 disposed along a third column B3 may emit blue light. The plurality of third sub-pixels PX3 included in the first column B1 may be electrically connected to each other, the plurality of fourth sub-pixels PX4 included in the second column B2 may be electrically connected to each other, and the fifth sub-pixels PX5 included in the third column B3 may also be electrically connected to each other. In such an embodiment, second sub-pixel PX2 may be disposed along a fourth column next to the third column B3, and the first sub-pixel PD may be disposed along a fifth column B5 next to the fourth column B4, as shown in FIG. 1

Hereinafter, the unit pixel 100 in FIG. 1 will be described in detail with reference to FIG. 2, which is a cross-sectional view taken along first and third directions D1 and D3 (D1XD3). Herein, the first direction D1 may be a row direction of the sub-pixels, the second direction D2 may be a column direction of the sub-pixels, and the third direction D3 may be a direction perpendicular to the first and second directions D1 and D2, or a thickness direction of the electronic device 1.

Figure 2:
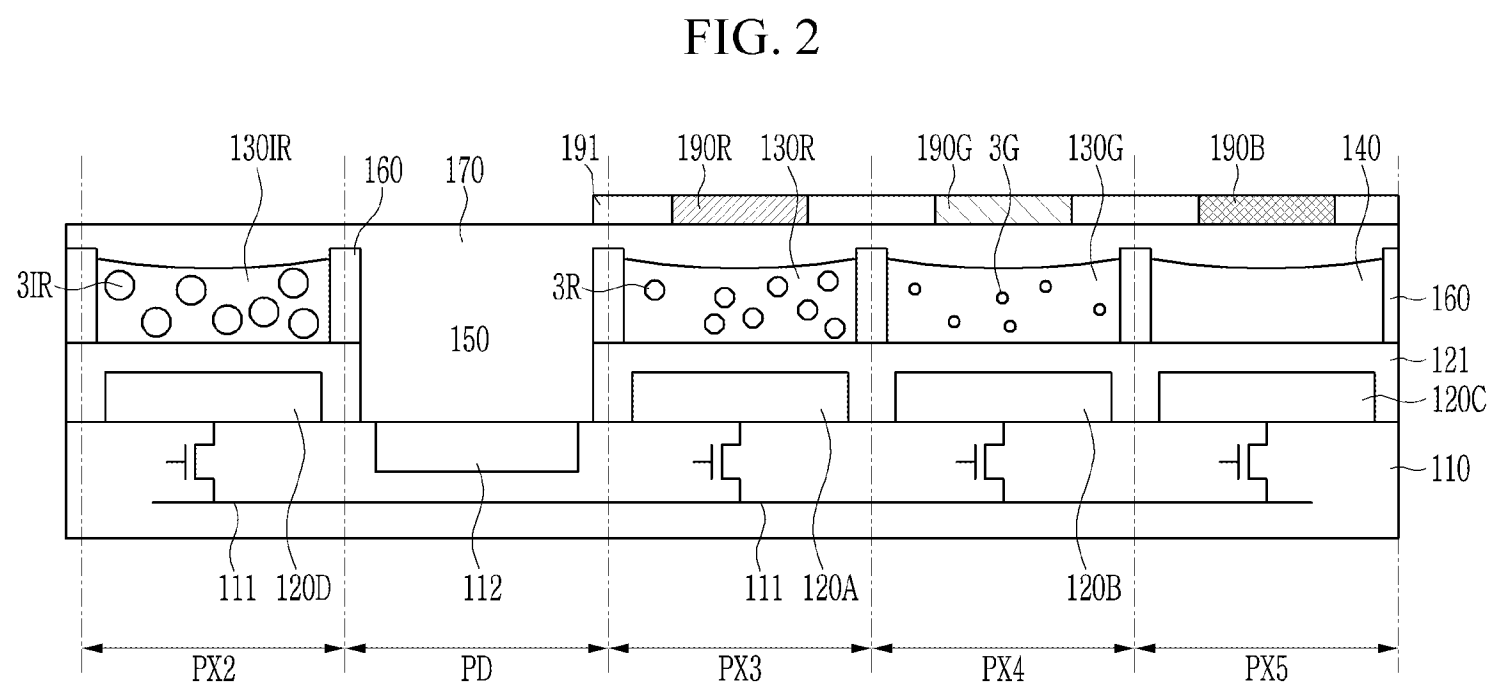

Referring to FIG. 2, an embodiment of the unit pixel 100 may include a plurality of light emitting elements 120A, 120B, 120C, and 120D and a blank area without a light emitting element therein. Each of the light emitting elements 120A, 120B, 120C, and 120D may constitute a corresponding one of the second sub-pixel PX2 to the fifth sub-pixel PX5, and the blank area without the light emitting element may constitute the first sub-pixel PD.

The first sub-pixel PD may include a substrate 110 including a photo-detecting unit 112, and a first transmission layer 150 disposed on the photo-detecting unit 112 of the substrate 110 and overlapping the photo-detecting unit 112 in the third direction D3.

Each of the second sub-pixel PX2 to fourth sub-pixel PX4 may include a substrate 110, a corresponding light emitting element 120A, 120B or 120D on the substrate 110, and a corresponding quantum dot color filter 130R, 130G or 130IR on the corresponding light emitting element 120A, 120B or 120D.

The fifth sub-pixel PX5 may include a substrate 110, a light emitting element 120C on the substrate 110, and a second transmission layer 140 disposed on the light emitting element 120C and overlapping the light emitting element 120C in the third direction D3.

The substrate 110 included in the first sub-pixel PX1 to the fifth sub-pixel PX5 may be integrally formed with each other as a single unitary unit, and may be, for example, a transparent substrate. In one embodiment, for example, the substrate 110 may include sapphire (Al$_2$O$_3$), gallium nitride (GaN), silicon carbide (SiC), gallium oxide (Ga$_2$O$_3$), lithium gallate (LiGaO$_2$), lithium aluminate (LiAlO$_2$), or magnesium aluminate (MgAl$_2$O$_4$).

The substrate 110 includes an integrated circuit unit 111 constituting the second sub-pixel PX2 to the fifth sub-pixel PX5 and a photo-detecting unit 112 constituting the first sub-pixel PD.

The unit pixel 100 may include a driving unit configured to supply power to each of the light emitting elements 120A, 120B, 120C, and 120D on the upper portion of and/or inside the substrate 110 corresponding to the second sub-pixel PX2 to the fifth sub-pixel PX5 and an integrated circuit unit 111 including a control unit for controlling the light emitting elements 120A, 120B, 120C, and 120D. In FIG. 2, for convenience of illustration, an embodiment where the integrated circuit unit 111 including a transistor circuit is shown.

In an embodiment, the photo-detecting unit 112 is included on the upper portion of and/or inside the substrate 110 corresponding to the first sub-pixel PD. In one embodiment, for example, the photo-detecting unit 112 may be a modification of a silicon transistor formed on a thin film transistor ("TFT") array and formed using an additional masking process, and may include a silicon-based photodiode such as a p-i-n photodiode.

However, in a case where a silicon-based photodiode is used as the photo-detecting unit, since the light-receiving limit wavelength thereof may be about 850 nanometers (nm), it is sufficient to receive infrared light, but it may be difficult to receive microwaves. In an embodiment of the electronic device 1 according to the invention, as will be described later, the light emitting elements 120A, 120B, 120C, and 120D may be micro light emitting diodes ("LED"s). In such an embodiment, the photo-detecting unit 112 includes a GaN-based photodiode when forming a micro LED instead of a CMOS-based Si-based photodiode, so that the range of light-receiving wavelengths thereof may be extended than that of a Si-based photodiode. In one embodiment, for example, the GaN-based photodiode may have a structure of a GaN buffer layer/AlGaN/AlGaN:Si/AlGaN:Mg layer.

The photo-detecting unit 112 may have a width of less than or equal to about 20 μμ, for example, less than or equal to about 15 μ, less than or equal to about 10 μ, or less than or equal to about 5 μand greater than or equal to about 0.1 μ, for example, greater than or equal to about 0.5 μ, or greater than or equal to about 1 μ, about 0.1 μto about 20 μ, for example about 0.5 μto about 10 μ, or about 0.5 μto about 5 μ, so that the unit pixel 100 may display an ultra-high resolution image. The width of the photo-detecting unit 112 may be a length in a direction generally perpendicular to the propagating direction of light (e.g., first or second direction D1 or D2 of FIG. 1). In an embodiment, the width of the photo-detecting unit 112 means the smaller width among the widths of the horizontal direction (the first direction D1 of FIG. 1) and vertical direction (the second direction D2 of FIG. 1).

A plurality of light emitting elements 120A, 120B, 120C, and 120D may be disposed on the substrate 110 corresponding to the second sub-pixel PX2 to the fifth sub-pixel PX5, respectively. The plurality of light emitting elements 120A, 120B, 120C, and 120D may emit light by an applied power source or a driving signal. The plurality of light emitting elements 120A, 120B, 120C, and 120D may include a semiconductor light emitting chip such as an LED. The plurality of light emitting elements 120A, 120B, 120C, and 120D may include a first light emitting element 120A in the third sub-pixel PX3 of the unit pixel 100, and a second light emitting element 120B in the fourth sub-pixel PX4, a third light emitting element 120C in the fifth sub-pixel PX5, and may further include a fourth light emitting element 120D in the second sub-pixel PX2.

In one embodiment, for example, the plurality of light emitting elements 120A, 120B, 120C, and 120D may emit blue light. In such an embodiment, a central wavelength of light emitted from the plurality of light emitting elements 120A, 120B, 120C, and 120D may be in a range of about 430 nm to about 470 nm, for example, in a range of about 440 nm to about 460 nm.

In one embodiment, for example, the electronic device 1 may have a pixel density in a range of about 200 pixels per inch ("ppi") to about 300 ppi. Accordingly, the horizontal and/or vertical width of each of the light emitting elements 120A, 120B, 120C, and 120D, and the pitch between adjacent light emitting elements 120A, 120B, 120C, and 120D may be substantially smaller than the horizontal length of the pixels and the pitch between the arranged pixels of general display devices, for example, the organic light emitting display device and/or other display devices. In one embodiment, for example, each of the light emitting elements 120A, 120B, 120C, and 120D may be a micro LED ("LED").

The plurality of light emitting elements 120A, 120B, 120C, and 120D may each have a width of less than or equal to about 20 $\mu$, for example less than or equal to about 15 $\mu$, less than or equal to about 10 $\mu$, or less than or equal to about 5 $\mu$and greater than or equal to about 0.1 $\mu$, for example, greater than or equal to about 0.5 $\mu$, or greater than or equal to about 1 $\mu$, about 0.1 $\mu$to about 20 $\mu$, for example, about 0.5 $\mu$to about 10 $\mu$, or about 0.5 $\mu$to about 5 $\mu$, so that the electronic device 1 may display an ultra-high resolution image. The width of each of the light emitting elements 120A, 120B, 120C, and 120D is a length in a direction substantially perpendicular to the propagating direction of light (the first or second direction D1 or D2 of FIG. 1). In addition, the width of each of the light emitting elements 120A, 120B, 120C, and 120D means the smaller width among the widths of the horizontal direction (the first direction D1 of FIG. 1) and vertical direction (the second direction D2 of FIG. 1).

The pitch between neighboring light emitting elements 120A, 120B, 120C, and 120D may be less than or equal to about 20 $\mu$, for example, less than or equal to about 15 $\mu$, less than or equal to about 10 $\mu$, or less than or equal to about 5$\mu$and greater than or equal to about 0.1 $\mu$, for example, greater than or equal to about 0.5 $\mu$, or greater than or equal to about 1 $\mu$, about 0.1 $\mu$to about 20 $\mu$, for example, about 0.5 $\mu$to about 10 $\mu$, or about 0.5 $\mu$to about 5 $\mu$, so that the unit pixel 100 may display an ultra-high resolution image.

When the width of the light emitting elements 120A, 120B, 120C, and 120D and/or the pitch between the light emitting elements 120A, 120B, 120C, and 120D is in the above ranges, the unit pixel 100 including the light emitting elements 120A, 120B, 120C, and 120D may display images of ultra-high resolution and ultra-high luminance compared with a conventional display devices.

The plurality of light emitting elements 120A, 120B, 120C, and 120D may be electrically connected to each other. In one embodiment, for example, the first light emitting elements 120A in the third sub-pixel PX3 may be electrically connected to each other, and the second light emitting elements 120B in the fourth sub-pixel PX4 may be connected to each other, and the third light emitting elements 120C in the fifth sub-pixel PX5 may be electrically connected to each other. In such an embodiment, the fourth light emitting elements 120D in the second sub-pixel PX2 may also be electrically connected to each other.

In such an embodiment, the first light emitting elements 120A may be in a state in which the drain electrode is electrically connected to each other, which is the same for the second light emitting elements 120B to the fourth light emitting elements 120D. According to an embodiment having such a connection, the light emitting elements 120A, 120B, 120C, and 120D in regions that emit light of a same color may be simultaneously driven. In an embodiment, as described above, the light emitting elements 120A, 120B, 120C, and 120D may have the configuration in which the drain electrodes are connected to each other, but the present disclosure is not limited thereto. Alternatively, a wiring connection through which a plurality of light emitting elements 120A, 120B, 120C, and 120D is connected to each other may be variously modified as long as the light emitting elements 120A, 120B, 120C, and 120D are allowed to be driven simultaneously with each other.

A protective layer 121 may be disposed on the plurality of light emitting elements 120A, 120B, 120C, and 120D. The protective layer 121 may include an inorganic material or an organic material. In an embodiment where the protective layer 121 includes an inorganic material, the inorganic material may include silicon oxide or silicon nitride. The protective layer 121 may planarize the upper surface while covering the plurality of light emitting elements 120A, 120B, 120C, and 120D.

A partition wall 160 may be disposed on the protective layer 121. The partition wall 160 may have a lattice shape extending along the first and second directions D1 and D2 of FIG. 1.

The partition wall 160 may partition the first sub-pixel PD to the fifth sub-pixel PX5, while blue light emitted from the light emitting elements 120A to 120D may be guided to be supplied to the top.

Figure 3:
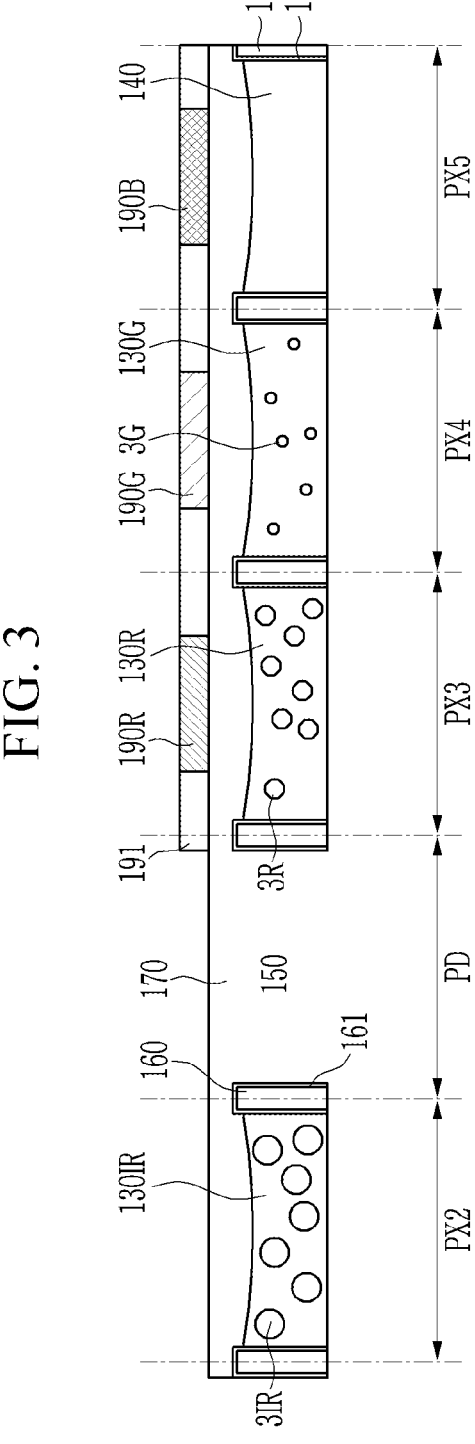
FIG. 3 is a cross-sectional view separately illustrating quantum dot color filters, an overcoat layer disposed thereon, and an absorption type color filter among the unit pixels of FIG. 2, showing an alternative embodiment of the partition wall.

FIG. 3 is a cross-sectional view separately illustrating quantum dot color filters 130R, 130G, and 130IR, an overcoat layer 170 disposed thereon, and absorption type color filters 190R, 190G, and 190B, among the unit pixels 100 of FIG. 2, showing an alternative embodiment of the partition wall 160. Referring to FIG. 3, in an alternative embodiment, the surface of the partition wall 160 may be covered with a light reflective layer 161. The light reflective layer 161 may cover all surfaces of the partition wall 160 except for the contact surfaces thereof with the protective layer 121.

The light reflective layer 161 may include Al, Cu, Ni, Ag, Au, and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The light reflective layer 161 may have a visible light reflectance of at least 50% or more, for example 60% or more, 70% or more, 80% or more, 90% or more, or even 100%.

Accordingly, the possibility that light supplied to the quantum dot color filters 130R, 130G, and 130IR is reflected by the light reflective layer 161 to reach the quantum dots 3 may be improved. As a result, the quantum dot color filters 130R, 130G, and 130IR may exhibit improved light extraction efficiency.

The quantum dot color filters 130R, 130G, and 130IR may be disposed in a space separated or defined by the partition walls 160. The quantum dot color filters 130R, 130G, and 130IR may convert and emit light incident from the light emitting elements 120A, 120B, and 120D using the quantum dots 3.

The third sub-pixel PX3 may include a first quantum dot color filter 130R configured to convert a second light, which is emitted from light emitting elements 120A, 120B, 120C, and 120D, into a third light, the fourth sub-pixel PX4 may include a second quantum dot color filter 130G configured to convert the second light into fourth light having a shorter wavelength than the third light, and the fifth sub-pixel PX5 may include a second transmission layer 140 configured to transmit second light. Alternatively, the second sub-pixel PX2 may include a third quantum dot color filter 130IR configured to convert the second light into first light having a longer wavelength than the third light.

The photo-detecting unit 112 may receive and detect the first to fourth lights, or a combination thereof, and in particular, may detect the first light.

The first quantum dot color filter 130R may include red quantum dots 3R. Accordingly, the incident blue light may be converted into red light and then emitted from the first quantum dot color filter 130R. The second quantum dot color filter 130G may include green quantum dots 3G. Accordingly, the incident blue light may be converted into green light and then emitted from the second quantum dot color filter 130G.

The third quantum dot color filter 130IR may convert incident second light or blue light into light in a wavelength region of about 780 nm to about 1500 nm and then emit the light in the wavelength region of about 780 nm to about 1500 nm. In one embodiment, for example, the third quantum dot color filter 130IR may convert the incident blue light into light in a wavelength region of about 780 nm to about 980 nm, or in a wavelength region of about 980 nm to about 1500 nm and then emit it. In one embodiment, for example, the third quantum dot color filter 130IR may convert the incident blue light into infrared light or microwave, and then emit the infrared light or microwave. Accordingly, the third quantum dot color filter 130IR may include infrared quantum dots 31R. The quantum dots 3 included in the first quantum dot color filter 130R, the second quantum dot color filter 130G, or optionally the third quantum dot color filter 130IR may each independently include a Group II-VI compound, a Group III-V compound, a Group IV-VI compound, a Group IV element or compound, a Group I-III-VI compound, a Group I-II-IV-VI compound, or a combination thereof.

The Group II-VI compound may include a binary compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, and a mixture thereof. The Group III-V compound may include a binary compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary compound selected from GaAl-NAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. In one embodiment, for example, the Group compound may include $CuInSe_2$, $CuInS_2$, CuInGaSe, or CuInGaS, but are not limited thereto. Examples of the Group I-II-IV-VI compound may include CuZnSnSe, or CuZnSnS, but are not limited thereto. The Group IV element or compound may be selected from a single substance selected from Si, Ge, and a mixture thereof; and a binary element compound selected from SiC, SiGe, and a mixture thereof.

In such an embodiment, the binary compound, the ternary compound, or the quaternary compound may be present in a particle having a substantially uniform concentration, or may be present in a particle having different concentration distributions in the same particle.

In such an embodiment, the quantum dots 3 may have a core/shell structure in which one quantum dot surrounds another quantum dot. The core and the shell may have an interface, and an element of at least one of the core or the shell in the interface may have a concentration gradient wherein the concentration of the element(s) of the shell decreases toward the core.

The quantum dots 3 may have an emission wavelength spectrum having a full width at half maximum ("FWHM") of less than or equal to about 45 nm, e.g., less than or equal to about 40 nm, or less than or equal to about 30 nm, and may have improved color purity and color gamut within these ranges. In such an embodiment, since the light emitted through the quantum dots 3 is emitted in all directions, the viewing angle may be improved.

The quantum dots 3 are commercially available or may be synthesized by any method. In one embodiment, for example, the quantum dots 3 may be a colloidal particle synthesized according to a wet chemical process. In the wet chemical process, precursors react in an organic solvent to grow crystal particles, and the organic solvent or a ligand compound may coordinate the surface of the quantum dots 3, controlling the growth of the crystal. In such an embodiment, the organic solvent and the ligand compound are well known in the art. In the chemical wet process, the synthesized colloidal quantum dot may be collected by adding a non-solvent to a reaction solution and centrifuging a final mixture. Such a collecting process may cause removal of at least one portion of the organic materials coordinated on the surface of the quantum dots 3. In one embodiment, for example, the non-solvent may be acetone, ethanol, methanol, or the like, but are not limited thereto.

The quantum dots 3 may have an organic ligand bound to a surface thereof. In an embodiment, the organic ligand may have a hydrophobic moiety. The organic ligand may be $RCOOH$, $RNH_2$, $R_2NH$, $R_3N$, $RSH$, $R_3PO$, $R_3P$, $ROH$, $RCOOR'$, $RPO(OH)_2$, $R_2POOH$, where, R and R' may each independently be hydrogen, a C5 to C24 substituted or unsubstituted aliphatic hydrocarbon group, for example a C5 to C24 alkyl group, a C5 to C24 alkenyl group, or a C5 to C20 aromatic hydrocarbon group, for example a C6 to C20 aryl group, provided that at least one is not hydrogen, or a combination thereof.

In one embodiment, for example, the organic ligand may include thiol compounds such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; phosphine compounds such as methyl phosphine, ethyl phosphine, propyl phosphine, butyl phosphine, pentyl phosphine, octylphosphine, dioctyl phosphine, tributylphosphine, trioctylphosphine, and the like; phosphine compounds or oxide compounds thereof such as methyl phosphine oxide, ethyl phosphine oxide, propyl phosphine oxide, butyl phosphine oxide pentyl phosphineoxide, tributylphosphineoxide, octylphosphine oxide, dioctyl phosphineoxide, and trioctylphosphineoxide; diphenyl phosphine, triphenyl phosphine compounds or oxide compounds thereof; (mono- or di) hexylphosphinic acid, (mono- or di) octylphosphinic acid, (mono- or di) dodecanephosphinic acid, (mono- or di) tetradecanephosphinic acid, (mono- or di) hexadecanephosphinic acid, (mono-or di) octadecanephosphinic acid, and the like, C5 to C20 alkyl phosphonic acid such as C5 to C20 (mono- or di) alkylphosphinic acid, hexylphosphonic acid, octylphosphonic acid, dodecanephosphonic acid, tetradecanephosphonic acid, hexadecanephosphonic acid, octadecanephosphonic acid, and the like, but are not limited thereto. The quantum dots $3$ may include the organic ligand alone or as a mixture of two or more.

In an embodiment where the quantum dots $3$ include red quantum dots $3R$, the red quantum dots $3R$ may include at least one selected from $(Ca, Sr, Ba)S$, $(Ca, Sr, Ba)_2Si_5N_8$, $CaAlSiN_3$, $CaMoO_4$ and $Eu_2Si_5N_8$, but are not limited thereto.

In an embodiment where the quantum dots $3$ include green quantum dots $3G$, the green quantum dots $3G$ may include at least one of yttrium aluminum garnet (YAG), $(Ca, Sr, Ba)_2SiO_4$, $SrGa_2S_4$, barium magnesium aluminate (BAM), alpha SiAION ($\alpha$-SiAION), beta SiAION ($\beta$-SiAION), $Ca_3Sc_2Si_3O_{12}$, $Tb_3Al_5O_{12}$, $BaSiO_4$, $CaAlSiON$, and $(Sr_{1-x}Ba_x)Si_2O_2N_2$, but are not limited thereto. The x may be any number between 0 to 1.

In an embodiment, the second transmission layer 140 emits incident light as it is without converting the incident light. In one embodiment, for example, blue light may be incident and blue light may be emitted as it is through the second transmission layer 140.

The second transmission layer 140 may include a transparent resin that transmits blue light. The second transmission layer 140 disposed in a region where the blue light emits includes separate quantum dots $3$ and transmits the incident blue light as it is.

Although not shown, the second transmission layer 140 may further include at least one selected from a dye and a pigment. The second transmission layer 140 including the dye or the pigment may reduce reflection of an external light and provide blue light having improved color purity.

Figure 4:
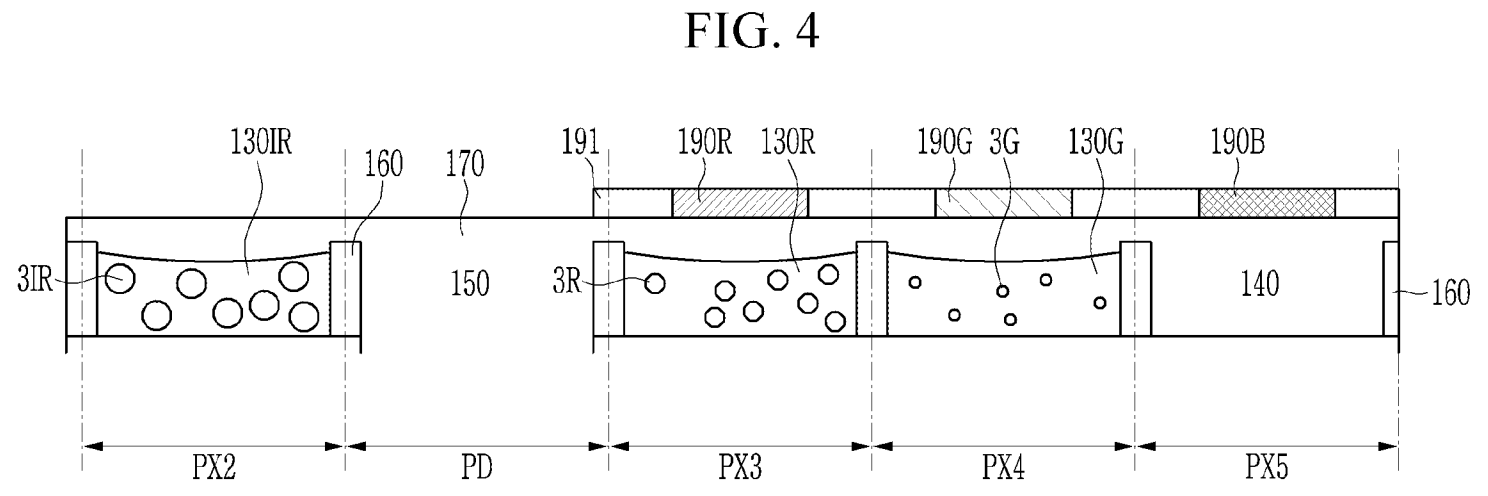

FIG. 4 is a cross-sectional view separately illustrating quantum dot color filters 130R, 130G, and 130IR, an overcoat layer 170 disposed thereon, and absorption type color filters 190R, 190G, and 190B among the unit pixels 100 of FIG. 2, showing an alternative embodiment of the second transmission layer 140. Referring to FIG. 4, in another alternative embodiment, the second transmission layer 140 may be omitted, and in such an embodiment, the overcoat layer 170 may instead fill the empty space of the second transmission layer 140.

In an embodiment, the second transmission layer 140 may have a light transmittance of about 50% or more, for example, about 60% or more, about 70% or more, about 80% or more, about 90% or more, or even 100% for visible light.

Each of the first quantum dot color filter 130R, the second quantum dot color filter 130G, the second transmission layer 140, or optionally the third quantum dot color filter 130IR may be spaced apart by the aforementioned partition wall 160.

Each of the first quantum dot color filter 130R, the second quantum dot color filter 130G, the second transmission layer 140, or optionally the third quantum dot color filter 130IR may be disposed to overlap each of the first light emitting element 120A to the fourth light emitting element 120D in the third direction D3.

The width of the first quantum dot color filter 130R, the width of the second quantum dot color filter 130G, the width of the second transmission layer 140, or the width of the third quantum dot color filter 130IR may be less than or equal to about 20 µ, for example, less than or equal to about 15 µ, less than or equal to about 10 µ, or less than or equal to about 5 µand greater than or equal to about 0.1 µ, for example, greater than or equal to about 0.5 µ, or greater than or equal to about 1 µ, about 0.1 µto about 20 µ, for example, about 0.5 µto about 10 µ, or about 0.5 µto about 5 µ. The width of the first quantum dot color filter 130R, the width of the second quantum dot color filter 130G, the width of the second transmission layer 140, and the width of the third quantum dot color filter 130IR may be the length of the direction (the first or second direction D1 or D2 of FIG. 1) substantially perpendicular to the light propagating direction. In addition, the widths of these mean the smaller width among the widths of the horizontal direction (the first direction D1 of FIG. 1) and vertical direction (the second direction D2 of FIG. 1).

Each pitch of the neighboring first quantum dot color filter 130R, second quantum dot color filter 130G, second transmission layer 140, or optionally third quantum dot color filter 130IR may be less than or equal to about 20 µ, for example, less than or equal to about 15 µ, less than or equal to about 10 µ, or less than or equal to about 5 µand greater than or equal to about 0.1 µ, for example, greater than or equal to about 0.5 µ, or greater than or equal to about 1 µ, about 0.1 µto about 20 µ, for example, about 0.5 µto about 10 µ, or about 0.5 µto about 5 µ.

In such an embodiment, by adjusting the width and/or pitch of each of the first quantum dot color filter 130R, the second quantum dot color filter 130G, the second transmission layer 140, or optionally the third quantum dot color filter 130IR to be in the above-mentioned range, blue light supplied from the plurality of light emitting elements 120A, 120B, 120C, and 120D in each sub-pixel PX may effectively enter the quantum dot color filters 130R, 130G, and 130IR.

In an embodiment, the height of the quantum dot color filters 130R, 130G, and 130IR may be the same as the height of the partition wall 160 or lower than the height of the partition wall 160. In such an embodiment, the height of each of the first quantum dot color filter 130R, the second quantum dot color filter 130G, or optionally the third quantum dot color filter 130IR may be less than or equal to the height of the partition wall 160.

In an embodiment, the first transmission layer 150 is disposed on the photo-detecting unit 112 of the substrate 110 corresponding to the first sub-pixel PD.

The first sub-pixel PD may be disposed between the second sub-pixel PX2 and an arrangement of the third sub-pixel PX3 to the fifth sub-pixel PXS, or outside the second sub-pixel PX2 or the arrangement of the third sub-pixel PX3 to the fifth sub-pixel PX5, and thus the first transmission layer 150 may also be disposed next to or between the plurality of light emitting elements 120A, 120B, 120C, and 120D. In such an embodiment, the first transmission layer 150 may be disposed in a position parallel to (or in a same layer or level as) the plurality of light emitting elements 120A, 120B, 120C, and 120D and the quantum dot color filters 130R, 130G, 130IR disposed on the plurality of light emitting elements 120A, 120B, 120C, 120D. In such an embodiment, the first transmission layer 150 may overlap the plurality of light emitting elements 120A, 120B, 120C, and 120D and the quantum dot color filters 130R, 130G, 130IR in the first direction D1.

The first transmission layer 150 may also pass incident light as it is. The first transmission layer 150 may include a transparent resin that transmits red light, green light, blue light, infrared light, and a combination thereof. The first transmission layer 150 may have a light transmittance of about 50% or more, for example, about 60% or more, about 70% or more, about 80% or more, about 90% or more, or even 100% for visible light and infrared light.

Although not shown, the first transmission layer 150 may also further include at least one selected from a dye and a pigment. The first transmission layer 150 including a dye or pigment may receive red light, green light, blue light, or infrared light having improved color purity.

In an embodiment, the first transmission layer 150 may be formed as or defined by an empty space, and in such an embodiment, the overcoat layer 170 may fill the empty space instead. Alternatively, the first transmission layer 150 may be formed separately from the overcoat layer 170 and may be filled with an inorganic material or an organic material. In an embodiment, where the first transmission layer 150 includes an inorganic material, the inorganic material may include silicon oxide or silicon nitride.

At least one of the first quantum dot color filter 130R, the second quantum dot color filter 130G, the second transmission layer 140, the first transmission layer 150, or optionally the third quantum dot color filter 130IR may further include a scattering body (not shown). Each of the first quantum dot color filter 130R, the second quantum dot color filter 130G, the second transmission layer 140, the first transmission layer 150, or optionally the third quantum dot color filter 130IR may have different content of the scattering body. The scattering body may increase the amount of light emitted or received by being converted or transformed through the first quantum dot color filter 130R, the second quantum dot color filter 130G, the second transmission layer 140, the first transmission layer 150, or optionally a third quantum dot color filter 130IR, and may uniformly provide front luminance and side luminance.

The scattering body may include any material for evenly scattering incident light. The scattering body may include, for example, at least one selected from $TiO_2$, $ZrO_2$, $Al2O_3$, $In_2O_3$, ZnO, $SnO_2$, $Sb_2O_3$, and ITO.

The first quantum dot color filter 130R, the second quantum dot color filter 130G, the second transmission layer 140, the first transmission layer 150, or optionally the third quantum dot color filter 130IR may include, for example, a photosensitive resin and may be formed through a photolithography process.

The planar area of the first quantum dot color filter 130R, the second quantum dot color filter 130G, the second transmission layer 140, the first transmission layer 150, or optionally the third quantum dot color filter 130IR may be larger than the planar area of the light emitting elements 120A, 120B, 120C, and 120D. Light emitted from the light emitting elements 120A, 120B, 120C, and 120D may have a Lambertian distribution. Blue light having a Lambertian distribution may be incident on an area larger than an emission area.

A ratio of a width to a height of each of the first quantum dot color filter 130R, the second quantum dot color filter 130G, the second transmission layer 140, the first transmission layer 150, or optionally the third quantum dot color filter 130IR may be from about 4:1 to about 1:1. In an embodiment where the ratio of the width to the height of each of the first quantum dot color filter 130R, the second quantum dot color filter 130G, the second transmission layer 140, the first transmission layer 150, or optionally the third quantum dot color filter 130IR is increased to about 1:1, it may be possible to provide the first quantum dot color filter 130R, the second quantum dot color filter 130G, and the second transmission layer 140, or optionally, a third quantum dot color filter 130IR which have a fairly narrow width (that is, the ratio of the width to the height is considerably high). That is, more precise patterning may be possible.

The overcoat layer 170 may be disposed on the quantum dot color filters 130R, 130G, and 130IR, the second transmission layer 140, and/or the first transmission layer 150. The overcoat layer 170 may include an inorganic material or an organic material. In an embodiment where the overcoat layer 170 includes an inorganic material, the inorganic material may include silicon oxide or silicon nitride.

The thickness of the overcoat layer 170 may be variously modified depending on the thickness of the quantum dot color filters 130R, 130G, 130IR, the target thickness of the unit pixel 100, the luminance and/or heat generation of the light emitting elements 120A, 120B, 120C, and 120D, but may be greater than or equal to about 1 μ, for example, greater than or equal to about 2 μ, greater than or equal to about 3 μ, greater than or equal to about 4 μ, or greater than or equal to about 5 μ, and less than or equal to about 10 μ, for example, less than or equal to about 9 μ, or less than or equal to about 8 μ, about 1 μto about 10 μ, for example, about 1 μto about 9 μ, about 1 μto about 8 μ, about 2 μto about 8 μ, about 3 μto about 8 μ, about 4 μto about 8 μ, or about 5 μto about 8 μ.

In such an embodiment where the thickness of the overcoat layer 170 is in the aforementioned ranges, it may be easy to planarize the unit pixel 100 and absorb and/or block heat that may be transmitted from the substrate 110, and thus degradation of the quantum dot color filters 130R, 130G, and 130IR may be effectively prevented.

In an embodiment, the overcoat layer 170 may be omitted in consideration of the surface shape of the quantum dot color filters 130R, 130G, and 130IR.

Figure 5:
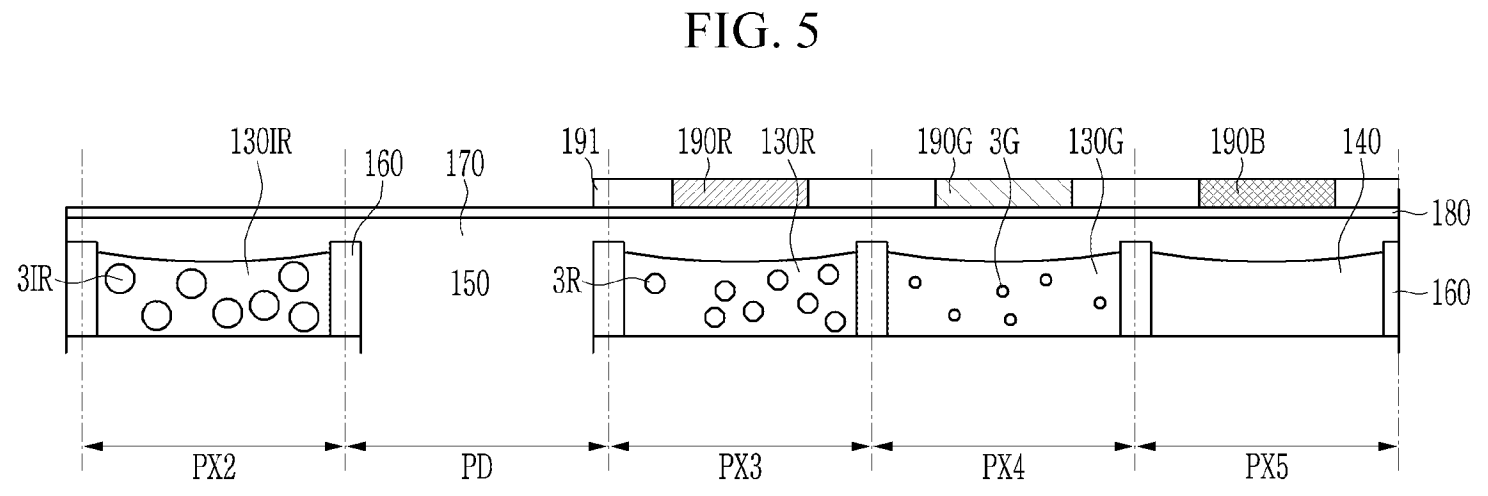

FIG. 5 is a cross-sectional view separately illustrating quantum dot color filters 130R, 130G, and 130IR, an overcoat layer 170 disposed thereon, and absorption type color filters 190R, 190G, and 190B among the unit pixel 100 of FIG. 2, showing an embodiment where the unit pixel 100 of FIG. 2 further includes the thin film encapsulation layer 180. Referring to FIG. 5, in an embodiment, a thin film encapsulation layer 180 may be disposed on the overcoat layer 170. The thin film encapsulation layer 180 may serve to seal the quantum dot color filters 130R, 130G, and 130IR so that the quantum dot color filters 130R, 130G, and 130IR are not exposed to external air or foreign substances.

The thin film encapsulation layer 180 may include an inorganic material.

The inorganic material may include a metal oxide, a metal nitride, a metal oxynitride, or a combination thereof. In an embodiment, materials applicable to the thin film encapsulation layer 180 include SiON, $Al_2O_3$, $SiO_2$, or a combination thereof, for example.

In an embodiment, the thin film encapsulation layer 180 may further include an organic material to improve sealing properties in addition to the aforementioned inorganic material. In such an embodiment, the organic material include at least one selected from an epoxy resin, a polyimide resin, and the like, and may be a material capable of inkjet printing, for example.

The thin film encapsulation layer 180 may include an inorganic layer including or made of at least one selected from the aforementioned inorganic material, and the thin film encapsulation layer 180 may include a layer in which the aforementioned inorganic material and an organic material are mixed, and the thin film encapsulation layer 180 may include both an inorganic layer and an organic layer.

The thin film encapsulation layer 180 may have a single layer or a multilayer structure of two or more layers. In one embodiment, for example, the thin film encapsulation layer 180 may have a structure in which an inorganic layer and an organic layer are alternately stacked one or more times.

The thin film encapsulation layer 180 may be adjusted to have a predetermined thickness for down-sizing of the unit pixel 100 while maintaining high sealing characteristics of the unit pixel 100. In one embodiment, for example, the thin film encapsulation layer 180 may have a thickness of greater than or equal to about 50 nm, for example, greater than or equal to about 100 nm, greater than or equal to about 150 nm, greater than or equal to about 200 nm, greater than or equal to about 250 nm, or greater than or equal to about 300 nm, and less than or equal to about 1000 nm, for example, less than or equal to about 950 nm, less than or equal to about 900 nm, less than or equal to about 850 nm, less than or equal to about 800 nm, less than or equal to about 750 nm, less than or equal to about 700 nm, less than or equal to about 650 nm, or less than or equal to about 600 nm, about 50 nm to about 1000 nm, for example, about 100 nm to about 1000 nm, about 100 nm to about 800 nm, about 100 nm to about 700 nm, or about 200 nm to about 600 nm.

The absorption type color filters 190R, 190G, 190B, and 1901R may be disposed on the overcoat layer 170. The absorption type color filters 190R, 190G, 190B, and 1901R may include a material capable of absorbing light in a predetermined wavelength region. Accordingly, color purity of light finally emitted from each pixel of the unit pixel 100 may be improved.

A material capable of absorbing light in a predetermined wavelength region may be an organic material or an organic material. In one embodiment, for example, the absorption type color filters 190R, 190G, 190B, and 1901R may be adhesive films (e.g., anisotropic conductive films) including a material capable of absorbing light in a predetermined wavelength region.

The absorption type color filters 190R, 190G, 190B, and 1901R may include a first absorption type color filter 190R in the third sub-pixel PX3, and a second absorption type color filter 190G in the fourth sub-pixel PX4, or a third absorption type color filter 190B in the fifth sub-pixel PX5.

Each of the first absorption type color filter 190R to the third absorption type color filter 190B may be disposed to overlap a corresponding one of the first light emitting elements 120A to third light emitting elements 120C in the third direction D3. The first absorption type color filter 190R to the third absorption type color filter 190B may be repeatedly disposed along the first direction D1.

The first absorption type color filter 190R may have a light absorption rate of about 50% or more, for example, about 60% or more, about 70% or more, about 80% or more, about 90% or more, or even about 100%, for visible light in a wavelength region other than red light.

The second absorption type color filter 190G may have a light absorption rate of about 50% or more, for example, about 60% or more, about 70% or more, about 80% or more, about 90% or more, or even about 100%, for visible light in a wavelength region other than green light.

The third absorption type color filter 190B may have a light absorption rate of about 50% or more, for example, about 60% or more, about 70% or more, about 80% or more, about 90% or more, or even about 100%, for visible light in a wavelength region other than blue light.

Figure 6:
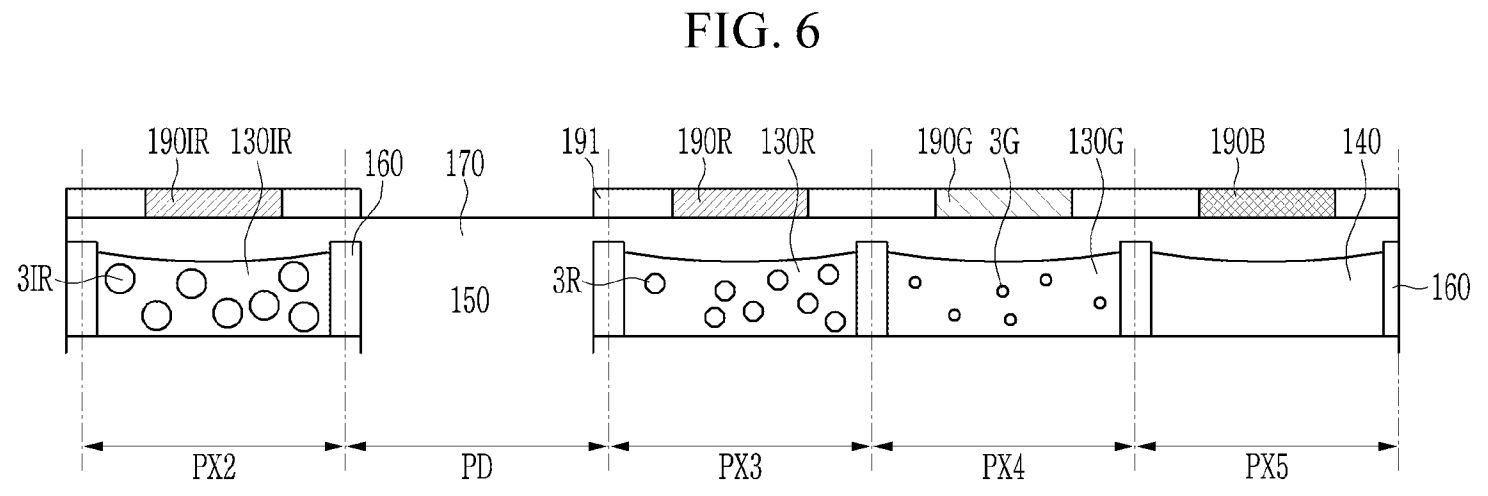

FIG. 6 is a cross-sectional view separately illustrating quantum dot color filters 130R, 130G, and 130IR, an overcoat layer 170 disposed thereon, and absorption type color filters 190R, 190G, 190B, and 1901R among the unit pixel 100 of FIG. 2, showing an embodiment where the fourth absorption type color filter 1901R is further included. Referring to FIG. 6, a fourth absorption type color filter 1901R may also be included on the overcoat layer 170 in the second sub-pixel PX2.

The fourth absorption type color filter 1901R may have a light absorption rate of about 50% or more, for example, about 60% or more, about 70% or more, 80% or more, about 90% or more, or even about 100%.

The first absorption type color filter 190R to the fourth absorption type color filter 1901R may be spaced apart from each other by the black matrix 191. The black matrix 191 may have a lattice shape extending along directions D1 and D2 of FIG. 1. The black matrix 191 may be an organic material, an inorganic material, or a metal.

The black matrix 191 may partition the second sub-pixel PX2 to the fifth sub-pixel PX5 to prevent color mixing of light emitted from the quantum dot color filters 130R, 130G, and 130IR, while the light supplied to the first absorption type color filter 190R to the fourth absorption type color filters 1901 R may be guided to be emitted to the outside of the unit pixel 100.

In an embodiment, as shown in FIG. 6, the height of the black matrix 191 may be lower than the first absorption type color filter 190R to the fourth absorption type color filter 1901R, but the present disclosure is not limited thereto. In one embodiment, for example, the black matrix 191may have a height equal to or greater than the height of the first absorption type color filter 190R to the fourth absorption type color filter 1901R.

Figure 7:
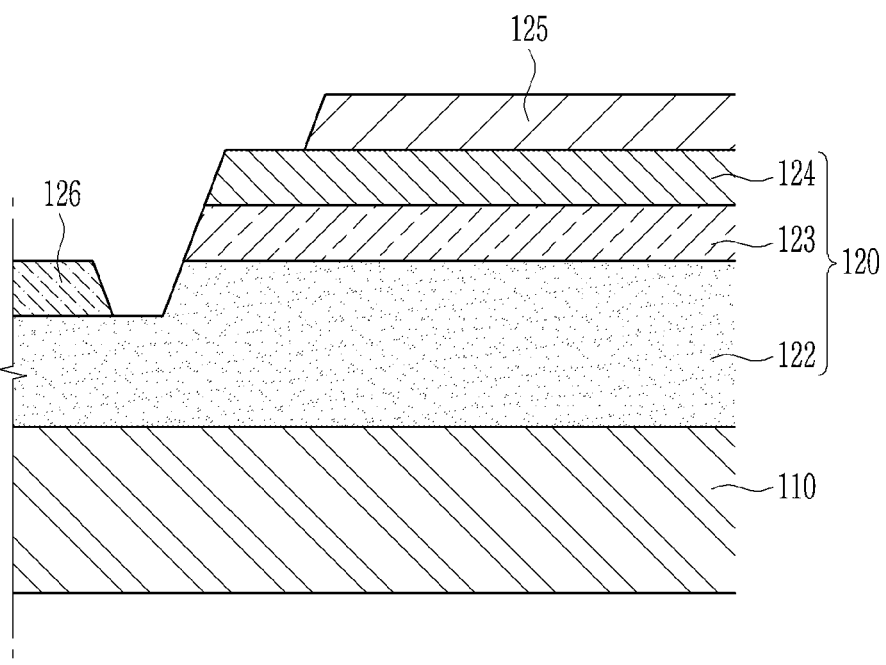
FIG. 7 is a schematic cross-sectional view of an embodiment of the light emitting element in FIG. 2, and FIGS. 8 and 9 are cross-sectional views illustrating various alternative embodiments of a unit pixel.

Hereinafter, the light emitting elements 120A, 120B, 120C, and 120D according to an embodiment will be described in detail with reference to FIG. 7. FIG. 7 is a schematic cross-sectional view of an embodiment of the light emitting elements 120A, 120B, 120C, and 120D.

In an embodiment, the light emitting elements 120A, 120B, 120C, and 120D may include a first conductivity-type semiconductor layer 122 on the substrate 110, an active layer 123 on the first conductivity-type semiconductor layer 122, and a second conductivity-type semiconductor layer 124 disposed on the active layer 123 and overlapping the first conductivity-type semiconductor layer 122 in the third direction D3.

In an embodiment, the first conductivity-type semiconductor layer 122 may be an n-type semiconductor layer, and the second conductivity-type semiconductor layer 124 may be a p-type semiconductor layer. In an embodiment, the first conductivity-type semiconductor layer 122 and the second conductivity-type semiconductor layer 124 may include a nitride semiconductor. The first conductivity-type semiconductor layer 122 and the second conductivity-type semiconductor layer 124 may have a formula of $Al_xIn_yGa_{(1-x-y)}N$, where $0 \leq x \leq 1$, $0 \leq y \leq 1$, and $0 \leq xy \leq 1$. The first conductivity-type semiconductor layer 122 and the second conductivity-type semiconductor layer 124 may include one or more materials selected from GaN, AlGaN, and InGaN.

The first conductivity-type semiconductor layer 122 may include an n-type doped nitride semiconductor material, and the second conductivity-type semiconductor layer 124 may include a p-type doped nitride semiconductor material. In one embodiment, for example, the first conductivity-type semiconductor layer 122 may include n-type doped GaN, and the second conductivity-type semiconductor layer 124 may include p-type doped GaN.

The active layer 123 may emit light having a predetermined energy by recombination of electrons and holes, and may have a multiple quantum well ("MQW") structure in which a quantum well layer and a quantum barrier layer are alternately stacked with each other. In an embodiment having a multiple quantum well structure, the active layer 123 may have an InGaN/GaN structure. The first conductivity-type semiconductor layer 122, the active layer 123, and the second conductivity-type semiconductor layer 124 may be epitaxial layers.

The light emitting elements 120A, 120B, 120C, and 120D may be formed by metal-organic chemical vapor deposition ("MOCVD"), hydride vapor phase epitaxy ("HVPE"), or molecular beam epitaxy ("MBE") process.

Although not shown, the protective layer 121, which is a nitride semiconductor thin film, may be disposed between the substrate 110 and the light emitting elements 120A, 120B, 120C, and 120D. The protective layer 121 may serve as a buffer layer to alleviate lattice mismatch between the substrate 110 and the first conductivity-type semiconductor layer 122.

The first conductivity-type semiconductor layer 122 may be connected to the first electrode 126, and the second conductivity-type semiconductor layer 124 may be connected to the second electrode 125. The first electrode 126 and the second electrode 125 are separated from each other and do not contact each other.

The first electrode 126 and the second electrode 125 may include or be made of a metal or alloy having high reflectance in a wavelength region of light emitted from the light emitting elements 120A, 120B, 120C, and 120D. The first electrode 126 and the second electrode 125 may include a single film including or made of a single material selected from Au, Sn, Ni, Pb, Ag, In, Cr, Ge, Si, Ti, W, and Pt, or an alloy including at least two materials selected therefrom, or a multiple film made of a combination thereof.

Figure 8:
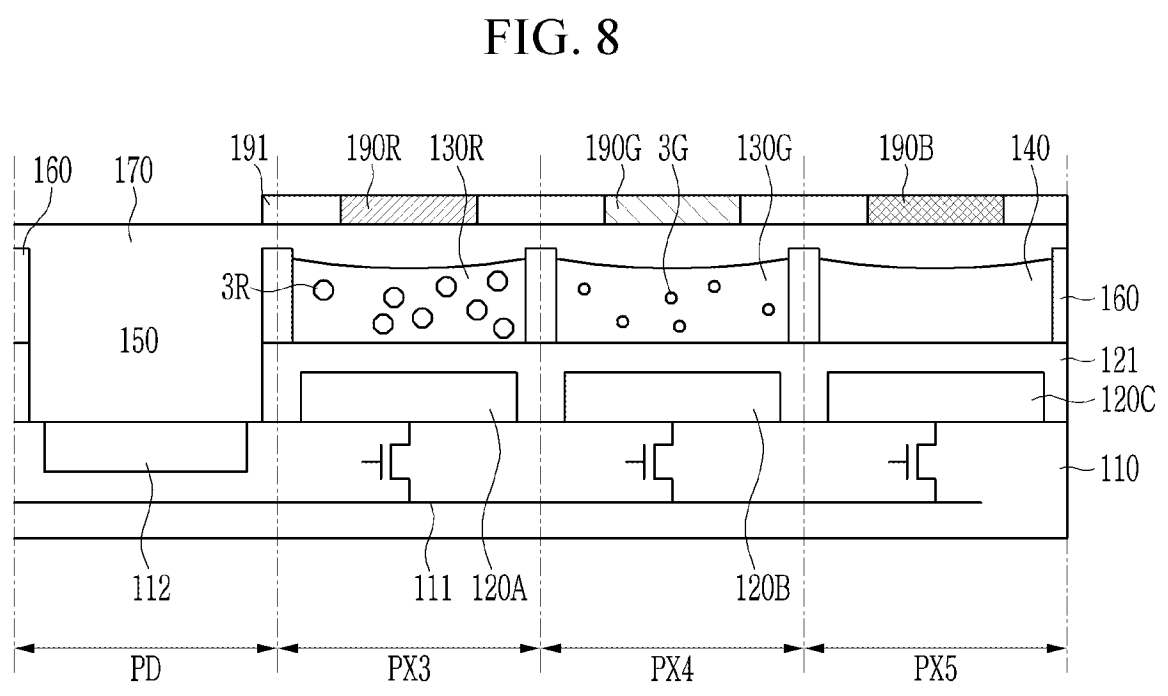
Figure 9:
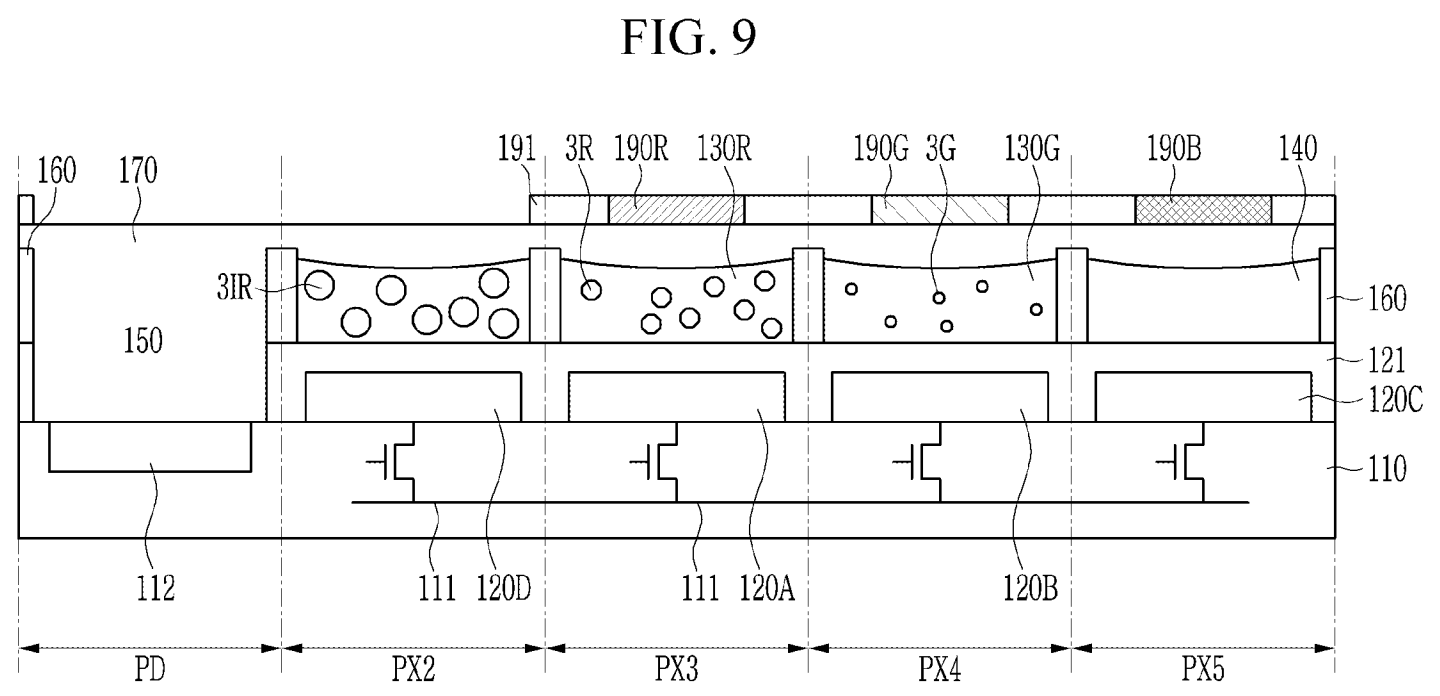

FIGS. 8 and 9 are cross-sectional views illustrating various alternative embodiments of the unit pixel 100.

Referring to FIG. 8, in an embodiment, the unit pixel 100 may not include a second sub-pixel PX2 capable of selectively emitting IR light. Accordingly, the first sub-pixel PD may be disposed to be adjacent to the outside of the third sub-pixel PX3 to the fifth sub-pixel PXS. In such an embodiment, the first sub-pixel PD may receive the second light to the fourth light emitted from the third sub-pixel PX3 to fifth sub-pixel PX5.

Referring to FIG. 9, in an alternative embodiment, the unit pixel 100 may include a second sub-pixel PX2 capable of selectively emitting infrared (Infra-Red, IR) light. The first sub-pixel PD is not disposed between the third sub-pixel PX3 to the fifth sub-pixel PX5 and the second sub-pixel PX2, but may be disposed to be adjacent to the outside of the second sub-pixel PX2. In such an embodiment, the first sub-pixel PD may better receive the first light emitted from the second sub-pixel PX2 without interfering with the second to fourth lights.

Hereinafter, an embodiment of a method of manufacturing the electronic device 1 according to an embodiment will be briefly described. Descriptions of the same elements as those described above may be omitted or simplified.

In an embodiment of a method of manufacturing the electronic device 1, the substrate 110 is formed by bonding a first substrate on which four complementary metal oxide semiconductor ("CMOS") transistors are provided or formed and one photodiode formed thereon, to a second substrate on which a blue light emitting p-LED is provided or formed, by wafer bonding.

The green, red, and infrared quantum dot color filters 130R, 130G, and 130IR are provided or formed on the partition walls on the blue light emitting p-LED, respectively. A transparent overcoat layer 170 is provided or formed on the quantum dot color filters 130R, 130G, and 130IR to planarize an upper surface thereof, a second transmission layer 140 is provided or formed on the fifth sub-pixel PX5, and the first transmission layer 150 is provided or formed in first sub-pixel PD.

The thin film encapsulation layer 180 is provided or formed on the overcoat layer 170 in order to block oxygen and moisture and the absorption type color filters 190R, 190G, 190B, and 1901R are provided or formed on the thin film encapsulation layer 180 to block residual blue light passing through the quantum dot color filters 130R, 130G, and 130IR, manufacturing an electronic device 1.

Embodiments of the electronic device 1 may be applied to a display device capable of simultaneously detecting light and displaying a display, and is particularly applicable to a mobile device, a watch, a virtual reality ("VR") device, an augmented reality ("AR") device, and the like. The display device may include a plurality of electronic elements according to the device configuration.

In embodiments, the electronic device 1 may be used to detect biological characteristics of a person using the device. Such a feature may be used for identification purposes as well as medical and diagnostic purposes.

In one embodiment, for example, the electronic device 1 may be installed on a smartphone or computer to authenticate a user.

In one embodiment, for example, the third sub-pixel PX3 to the fifth sub-pixel PX5 of the electronic device 1 may display an arbitrary image or command, and the second sub-pixel PX2 may emit infrared light. The emitted infrared light may be reflected by a body portion on the surface of the electronic device 1 or in contact with the electronic device 1, and may be absorbed by the first sub-pixel PD. The signal absorbed by the first sub-pixel PD is processed by the photo-detecting circuit to identify features of body portions such as fingerprints, blood vessels, face recognition, and combinations thereof.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device, comprising
a plurality of unit pixels arranged in a matrix form,
wherein each of the unit pixels comprises a plurality of sub-pixels linearly arranged therein,
wherein the plurality of sub-pixels comprises:
    a first sub-pixel comprising a photo-detecting unit,
    a second sub-pixel comprising a light emitting element having a width of less than or equal to about 20 micrometers, and a quantum dot color filter overlapping the light emitting element, wherein the second sub-pixel emits a first light from the quantum dot color filter thereof; and
    a third sub-pixel which emits a third light having a wavelength different from a wavelength of the first light,
    wherein the photo-detecting unit detects the first light emitted from the quantum dot color filter,
    wherein the first sub-pixel in one unit pixel is disposed between the second sub-pixel and the third sub-pixel in the one unit pixel, and
    wherein the unit pixel further comprises a fourth sub-pixel which emits a fourth light having a wavelength different from the wavelength of the first light and the wavelength of the third light.

2. The electronic device of claim 1, wherein the light emitting element is a micro light emitting diode.

3. The electronic device of claim 1, wherein the first light is in a wavelength region of about 780 nanometers to about 1500 nanometers.

4. The electronic device of claim 1, wherein the light emitting element emits a second light in a wavelength region of about 430 nanometers to about 470 nanometers.

5. The electronic device of claim 4, wherein the quantum dot color filter converts the second light into the first light.

6. The electronic device of claim 1, wherein the photo-detecting unit comprises a photodiode.

7. The electronic device of claim 1, wherein the photo-detecting unit has a width of less than or equal to about 20 micrometers.

8. The electronic device of claim 1, wherein the first sub-pixel is disposed outside the second sub-pixel or the third sub-pixel.

9. The electronic device of claim 1, wherein each of the second sub-pixel and the third sub-pixel comprises:
    a light emitting element having a width of less than or equal to about 20 micrometers; and a quantum dot color filter disposed on the light emitting element and overlapping the light emitting element.

10. The electronic device of claim 9, wherein
each of the second sub-pixel and the third sub-pixel further comprises partition walls which partition the quantum dot color filter.

11. The electronic device of claim 9, wherein the first sub-pixel further comprises a first transmission layer overlapping the photo-detecting unit.

12. The electronic device of claim 11, wherein
the first transmission layer is disposed in a position parallel to the light emitting element in the second sub-pixel or the third sub-pixel, and in a position parallel to the quantum dot color filter disposed on the light emitting element.

13. The electronic device of claim 9, wherein each of the second sub-pixel and the third sub-pixel further comprises an overcoat layer on the quantum dot color filter.

14. The electronic device of claim 9, wherein
each of the second sub-pixel and the third sub-pixel further comprises an absorption type color filter on the quantum dot color filter.

15. A display device comprising the electronic device of claim 1.

16. An electronic device, comprising:
a plurality of unit pixels arranged in a matrix form,
wherein each of the unit pixels comprises a plurality of sub-pixels linearly arranged therein,
wherein the plurality of sub-pixels comprises:
a first sub-pixel comprising a photo-detecting unit;
a second sub-pixel comprising a light emitting element having a width of less than or equal to about 20 micrometers, and a quantum dot color filter overlapping the light emitting element, wherein the second sub-pixel emits a first light from the quantum dot color filter thereof; and
a third sub-pixel which emits a third light having a wavelength different from a wavelength of the first light,
wherein the photo-detecting unit detects the first light emitted from the quantum dot color filter,
wherein the first sub-pixel in one unit pixel is disposed between the second sub-pixel and the third sub-pixel in the one unit pixel, and
wherein the unit pixel further comprises a fifth sub-pixel which emits a second light in a wavelength region of about 430 nanometers to about 470 nanometers.

17. The electronic device of claim 16, wherein
the fifth sub-pixel comprises
a light emitting element having a width of less than or equal to about 20 micrometers, and
a second transmission layer disposed on the light emitting element and overlapping the light emitting element.

* * * * *